United States Patent
Kwon et al.

(10) Patent No.: US 9,287,342 B2
(45) Date of Patent: Mar. 15, 2016

(54) FLEXIBLE ORGANIC LIGHT EMITTING DISPLAY AND METHOD OF MANUFACTURING THE SAME

(71) Applicant: LG Display Co., Ltd., Seoul (KR)

(72) Inventors: SeYeoul Kwon, Goyang-si (KR); SangCheon Youn, Seoul (KR); Saemleenuri Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/559,386

(22) Filed: Dec. 3, 2014

(65) Prior Publication Data

US 2015/0179728 A1    Jun. 25, 2015

(30) Foreign Application Priority Data

Dec. 24, 2013    (KR) .................. 10-2013-0162937

(51) Int. Cl.
  *H01L 27/32*    (2006.01)
  *H01L 51/00*    (2006.01)
(52) U.S. Cl.
  CPC ........ *H01L 27/3276* (2013.01); *H01L 27/3258* (2013.01); *H01L 51/0097* (2013.01)

(58) Field of Classification Search
  None
  See application file for complete search history.

(56) References Cited

U.S. PATENT DOCUMENTS

| | | | |
|---|---|---|---|
| 2012/0062447 A1* | 3/2012 | Tseng | G02F 1/136286 345/33 |
| 2014/0232956 A1* | 8/2014 | Kwon | G02F 1/133305 349/12 |

* cited by examiner

*Primary Examiner* — Charles Garber
*Assistant Examiner* — Brigitte Paterson
(74) *Attorney, Agent, or Firm* — Fenwick & West LLP

(57) ABSTRACT

Provided is a flexible organic light-emitting display device. The flexible display device includes a flexible substrate having a display area, a non-display area, and a bending area. On the flexible substrate, a first insulation layer is formed in a part of the non-display area. The first insulation layer includes a zigzag pattern. A plurality of wirings are electrically connected to the display area and are extended to traverse the non-display area and the bending area and are disposed on the first insulation layer. On the first insulation layer and the plurality of wirings, a passivation layer is formed. By virtue of a zigzag pattern of the first insulation layer, the frequency of occurrence of cracks in the passivation layer is reduced.

20 Claims, 9 Drawing Sheets

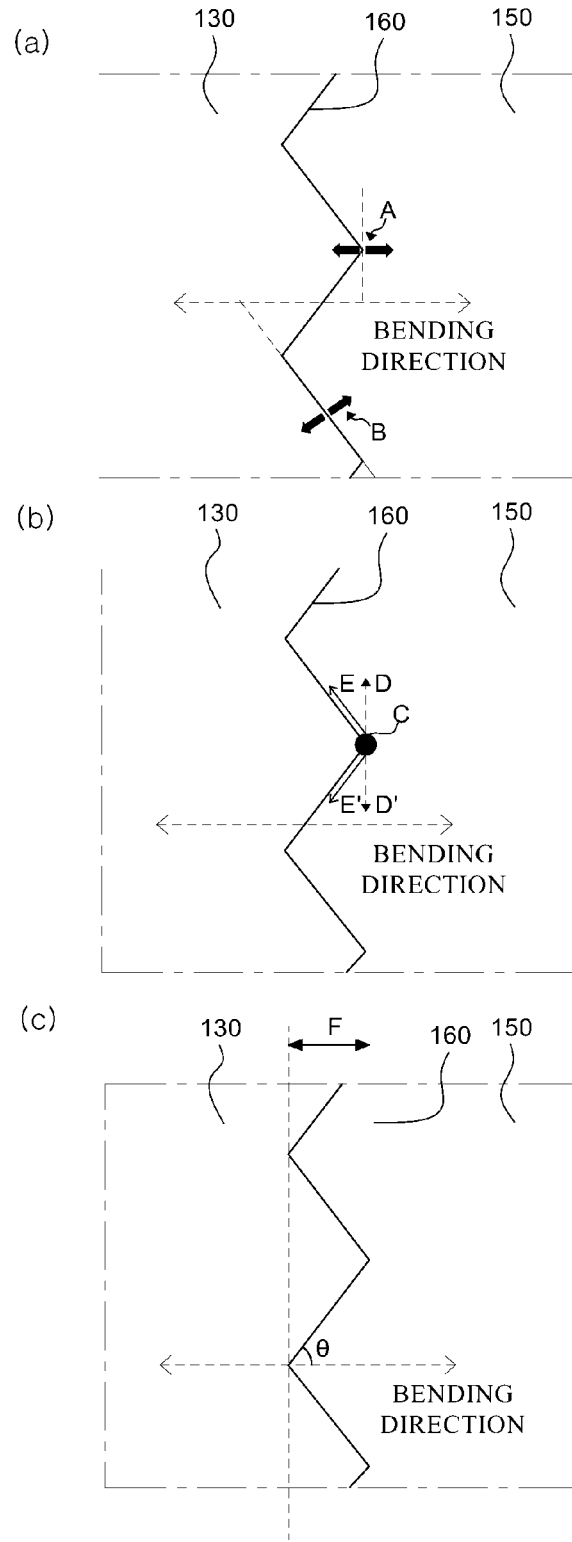

FLEXIBLE ORGANIC LIGHT EMITTING DISPLAY AND METHOD OF MANUFACTURING THE SAME

CROSS-REFERENCE TO RELATED APPLICATIONS

This application claims the priority of Korean Patent Application No. 10-2013-0162937 filed on Dec. 24, 2013, in the Korean Intellectual Property Office, the disclosure of which is incorporated herein by reference.

BACKGROUND

1. Field of Technology

The present disclosure relates to a flexible organic light-emitting display device and a method of fabricating the same. More particularly, the present disclosure relates to a flexible organic light-emitting display device to suppress cracks caused by stress in a passivation layer when the display device is bent, and a method of fabricating the same.

2. Description of the Related Art

In recent years, a flexible display device has attracted attention as a next generation display device. The flexible display device is capable of displaying an image while the flexible display device is bent like paper. The flexible display device is formed of a display unit and a wiring on a flexible material, for example, a flexible substrate such as plastic.

Applications of such flexible display devices are increasing from computer monitors and televisions to personal portable devices. Accordingly, flexible display devices with a larger display area with reduced volume and weight is under active research. In particular, developing a flexible organic light-emitting display device is also an issue, because an organic light-emitting display device (OLED) has advantages over a liquid crystal display device (LCD) in that the former does not require separate light sources resulting in the OLED device being made thinner.

SUMMARY

Demands for a flexible organic light-emitting display device have increased recently. Accordingly, it is necessary to obtain flexibility of a substrate, various types of insulation layers formed on the substrate, and wirings made of conductive materials. As for the substrate, the flexibility can be obtained by forming the substrate with a flexible material such as plastic.

Incidentally, in an organic light-emitting display device, by bending a bending area of an area where light is not emitted, areas where light is not emitted can be minimized. When the bending area is bent, wirings and a passivation layer which is an inorganic film or organic film, formed in the bending area receive stress caused by the bending such that they may be disconnected.

In order to reduce a short(s) of the wirings and disconnection of the passivation layer, it is conceivable to remove a multi-buffer layer, a gate insulation layer and an interlayer insulation layer from the bending area. If all of the multi-buffer layer, the gate insulation layer and the interlayer insulation layer are removed from the bending area, only the wirings and the passivation layer remain in the bending area. Thus, the thickness of the flexible light-emitting display device in the bending area decreases. As the thickness of the flexible light-emitting display device in the bending area decreases, the stress exerted on the wirings and the passivation layer formed in the bending area decreases. As a result, cracks are significantly reduced in the wirings and the passivation layer formed in the bending area.

As such, cracks are reduced in the wirings and the passivation layer formed in the bending area when the multi-buffer layer, the gate insulation layer and the interlayer insulation layer are removed from the bending area. However, cracks in the passivation layer may increase in the region where the multi-buffer layer, the gate insulation layer and the interlayer insulation layer are removed, i.e., the region where a step is created. The factors increasing cracks in the passivation layer where a step is created may include step coverage of the passivation layer covering the step, and a shim formed at a lower portion of the passivation layer.

The step coverage refers to the ability to apply a film evenly on a wall and a bottom of a trench or a hole, which has a high height-to-width ratio. That is, if the step coverage of the passivation layer is not good, the passivation layer has a thin thickness on the side surface of the step. The thin thickness of the passivation layer on the side surface of the step may be more vulnerable to the stress caused by the bending.

In addition, a shim may be formed at the lower end of the side surface of a step. A shim refers to a groove formed at the end of a side surface. The thickness of the passivation layer is abruptly decreased where a shim is formed, and thus cracks are likely to occur near the shim. Therefore, the passivation layer formed on the side surface of the step is more vulnerable to the stress caused by the bending.

If at least some of the multi-buffer layer, the gate insulation layer and the interlayer insulation layer are removed from the bending area, cracks in the passivation layer may propagate at a border where the at least some of the multi-buffer layer, the gate insulation layer and the interlayer insulation layer is removed.

A crack in the passivation layer as a result of the bending stress may propagate from the origin of the crack. The propagation of a crack means that the crack is extended to a position vulnerable to the stress.

In particular, cracks in the passivation layer are closely associated with cracks in wirings. That is, a crack occurs in the passivation layer first, and then may be extended to an area where the passivation layer meets a line. When this happens, the crack in the passivation layer is extended to cause a crack in a line under the passivation layer. There are many known factors how a crack in the passivation layer causes a crack in the line under the passivation layer. One of the known factors is that force generated when a crack occurs in the passivation layer causes a crack in a line.

When a crack occurs in a line, signals cannot be transmitted normally and thus a thin-film transistor or an organic light-emitting element fails to function normally. Therefore, the crack in the line results in the failure of the organic light-emitting display device.

In turn, when at least some of the multi-buffer layer, the gate insulation layer and the interlayer insulation layer are removed from the bending area, cracks occurring at the wirings and the passivation layers in the bending area can be reduced. However, a crack may occur in the passivation layer and the crack, if having occurred, may propagate at a border where the at least some of the multi-buffer layer, the gate insulation layer and the interlayer insulation layer are removed. Therefore, suppressing cracks in the passivation layer and the propagation of the crack is required.

An object of the present disclosure is to provide a flexible organic light-emitting display device which can reduce stress that causes cracks in wirings and a passivation layer at a step when at least some of the multi-buffer layer, the gate insulation layer and the interlayer insulation layer are removed from the bending area.

Another object of the present disclosure is to provide a flexible organic light-emitting display device, in which a crack in a passivation layer does not propagate to a line under the passivation layer.

The objects of the present invention are not limited to the aforementioned objects, and other objects, which are not mentioned above, will be apparent to those skilled in the art from the following description.

According to an aspect of the present disclosure, there is provided a flexible organic light-emitting display device. The flexible display device includes a flexible substrate having a display area, a non-display area extended from the display area, and a bending area extended from the non-display area. In the display area, a display unit includes a thin-film transistor and an organic light-emitting element. On the flexible substrate, a first insulation layer is formed in a part of the non-display area extended from the display area. The first insulation layer includes a zigzag pattern. A plurality of wirings is electrically connected to the display area. The plurality of wirings is extended to traverse the non-display area and the bending area and is disposed on the first insulation layer in a part of the non-display area. On the first insulation layer and the plurality of wirings, a passivation layer is formed. By virtue of a zigzag pattern of the first insulation layer, the frequency of occurrence of cracks in the passivation layer is reduced. Further, even if a crack has occurred in the passivation layer, the crack in the passivation is less likely to be connected to a crack in the passivation layer that meets a line by virtue of the zigzag pattern. As a result, it is possible to suppress cracks in wirings, and hence to reduce failure of a thin-film transistor or the like due to the cracks in the wirings.

According to another aspect of the present disclosure, there is provided a novel flexible organic light-emitting display device. The flexible organic light-emitting display device includes a flexible substrate having a non-bending area and a bending area extended from the non-bending area. In addition, the flexible organic light-emitting display device includes a first insulation layer formed on the flexible substrate in the non-bending area, and a passivation layer formed on the first insulation layer. The first insulation layer has a zigzag pattern between the non-bending area and the bending area. The frequency of occurrence of cracks in the passivation layer is reduced by virtue of the zigzag pattern.

According to yet another aspect of the present disclosure, there is provided a method of fabricating a novel flexible organic light-emitting display device. Initially, a second insulation layer is deposited on a flexible substrate including a display area, a non-display area extended from the display area, and a bending area extended from the non-display area. Then, a first insulation layer is deposited on the second insulation layer. The second insulation layer and the first insulation layer are patterned in zigzag patterns in a part of the non-display area. Then, the first insulation layer patterned in the remaining part of the non-display area so that the second insulation layer is exposed. Wirings are formed on the first insulation layer and the second so that they are extended from the display area to traverse the bending area. The passivation layer is deposited on the wirings, and the bending area of the flexible substrate is bent.

According to still another aspect of the present disclosure, there is provided a method of fabricating a flexible organic light-emitting display device. Initially, a second insulation layer is deposited on a flexible substrate including a display area, a non-display area extended from the display area, and a bending area extended from the non-display area. The second insulation layer is patterned in a zigzag pattern to be formed in the display area and a part of the non-display area. Then, the first insulation layer is deposited to cover the second insulation layer. The first insulation layer is patterned in a zigzag pattern so that the first insulation layer is formed between the zigzag pattern of the second insulation layer formed the part of the non-display area and the bending area. On the patterned first insulation layer, wirings are formed extending from the display area to traverse the bending area. The passivation layer is deposited on the wirings. In the flexible organic light-emitting display device fabricated according to the method, the frequency of occurrence of cracks in a passivation layer is reduced and a crack in the passivation is less likely to be connected to a crack in the passivation layer that meets a line.

The detailed respects of other embodiments are included in the detailed specification and drawings.

BRIEF DESCRIPTION OF THE DRAWINGS

The above and other aspects, features and other advantages of the present invention will be more clearly understood from the following detailed description taken in conjunction with the accompanying drawings, in which:

FIG. 1C (a) is an enlarged view of the zigzag pattern of the first insulation layer in the non-display area of FIG. 1B, illustrating the reduced occurrence rate of cracks in the passivation layer;

FIG. 1C (b) is an enlarged plane view illustrating the direction in which a crack line is extended in the zigzag pattern of the flexible organic light-emitting display device according to the exemplary embodiment of the present disclosure;

FIG. 1C (c) is an enlarged plane view illustrating the shape of the zigzag pattern of the flexible organic light-emitting display device according to the exemplary embodiment of the present disclosure;

DETAILED DESCRIPTION

Figure 1A:
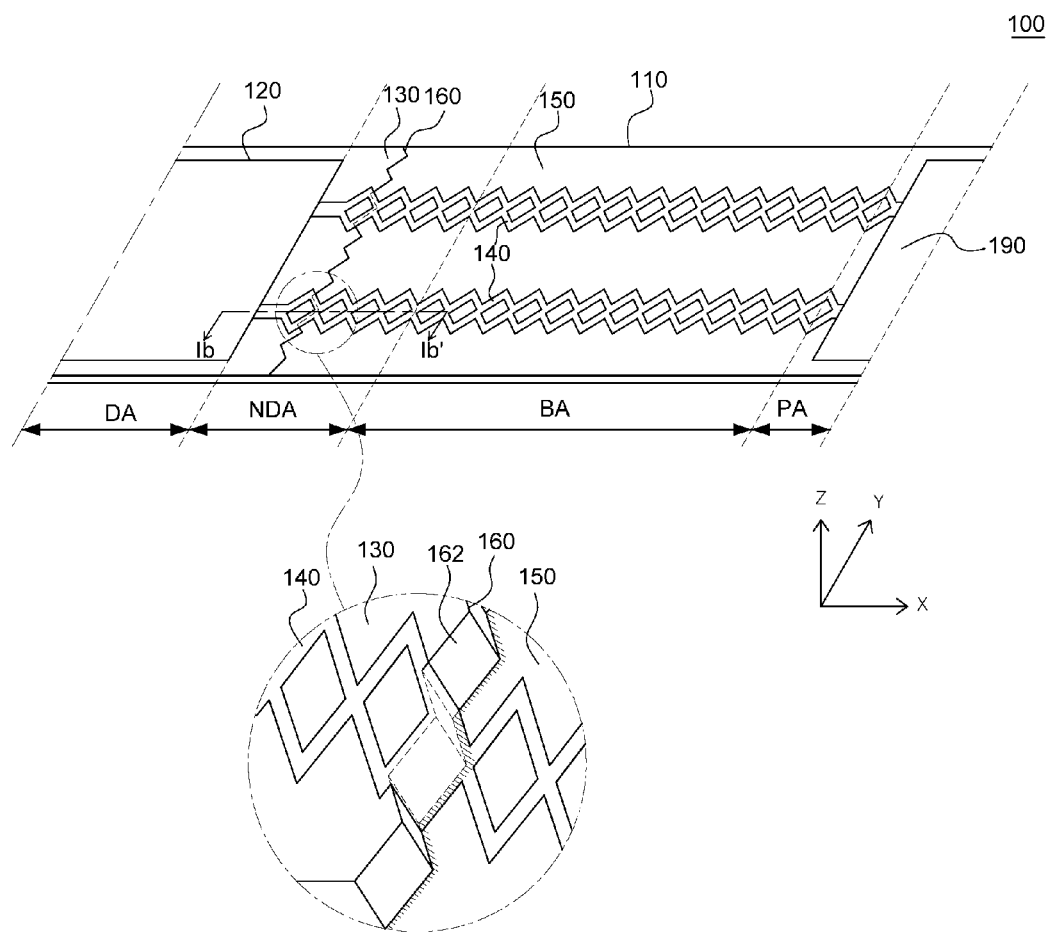
FIG. 1A is a schematic perspective view of a flexible organic light-emitting display device according to an exemplary embodiment of the present disclosure before a bending area is bent, illustrating the shapes of wirings and a first insulation layer.

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

Although first, second, and the like are used in order to describe various components, the components are not limited by the terms. The above terms are used only to discriminate one component from the other component. Therefore, a first component mentioned below may be a second component within the technical spirit of the present invention.

The same reference numerals indicate the same elements throughout the specification.

In the drawings, size and thickness of each element are arbitrarily illustrated for convenience of description, and the present invention is not necessarily limited to those illustrated in the drawings.

The components of various embodiments of the present invention can be partially or entirely bonded to or combined with each other and can be interlocked and operated in technically various ways as can be fully understood by an ordinary person skilled in the art, and the embodiments can be carried out independently of or in association with each other.

A flexible organic light-emitting display device refers to a display device with flexibility. Such a flexible display device 100 may also be referred to as a bendable display device, a rollable display device, an unbreakable display device, a foldable display device, a twistable display device, a stretchable display device, a winkable display device, a resilient display device, an elastic display device, or the like. The type of flexible organic light-emitting display devices may include a curved display device. The curved display device refers to a flexible organic light-emitting display device that stays bent once it has been bent in a particular direction.

Hereinafter, various embodiments of the present invention will be described in detail with reference to the accompanying drawings.

Figure 1B:
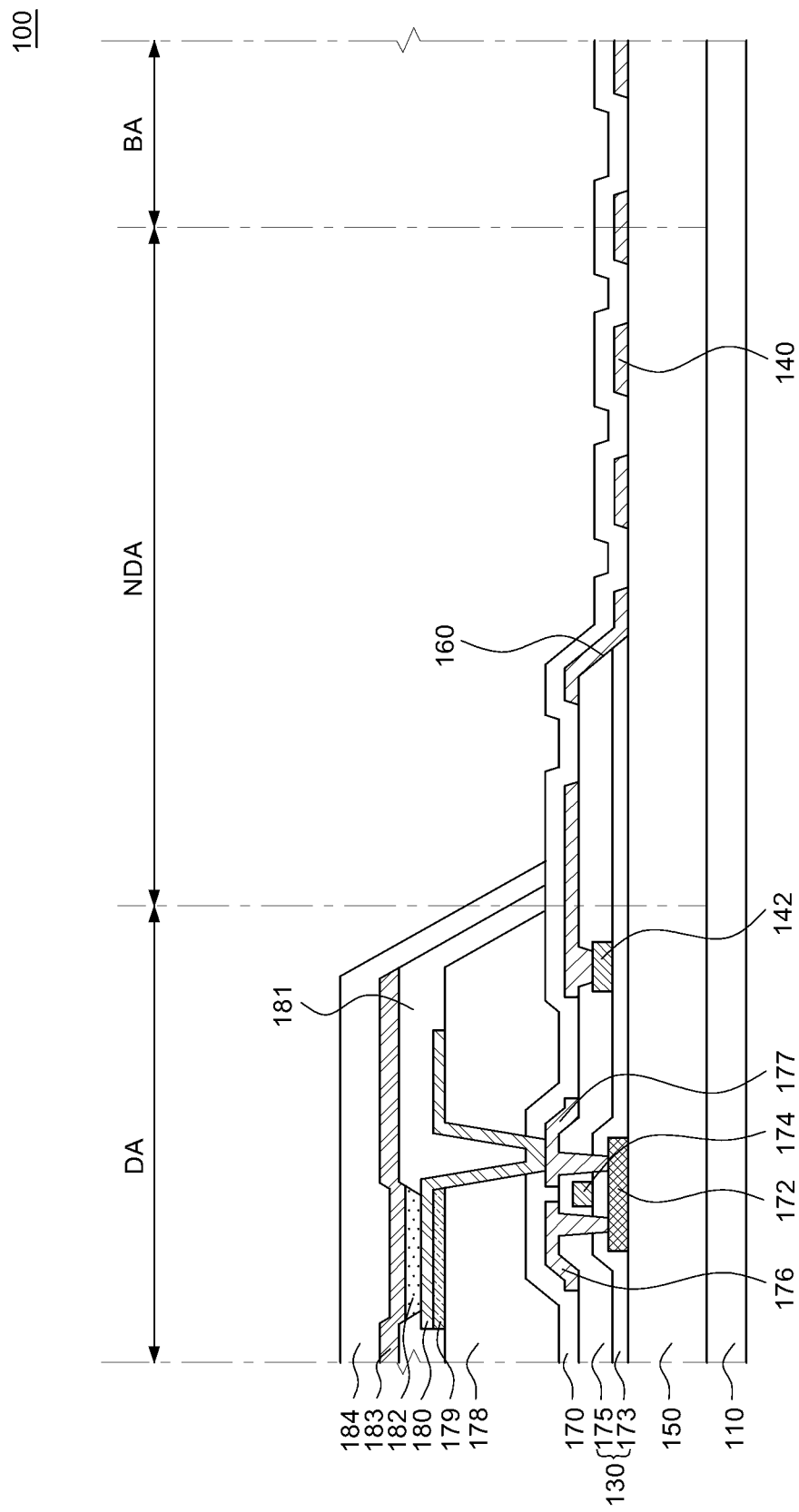
FIG. 1B is a cross-sectional view of the flexible organic light-emitting display device taken along line Ib-Ib' of FIG. 1A.

FIG. 1A is a schematic perspective view of a flexible organic light-emitting display device according to an exemplary embodiment of the present disclosure before a bending area is bent, illustrating the shapes of wirings and a first insulation layer. FIG. 1B is a cross-sectional view of the flexible organic light-emitting display device taken along line Ib-Ib' of FIG. 1A.

In this disclosure, with reference to FIG. 1A, the term "bending" means that, regarding flexible substrate 110 on the x-y plane, the part of the flexible substrate 110 on the positive side of the x-axis is bent toward the negative side of the x-axis passing through the negative side of the z-axis. Further, when the flexible substrate 110 is bent in a particular direction, the particular direction is referred to as the bending direction.

Referring to FIG. 1A, the flexible organic light-emitting display device 100 includes a flexible substrate 110, a display unit 120, a first insulation layer 130, a plurality of wirings 140, a multi-buffer layer 150, and a pad unit 190.

The flexible substrate 110 supports a variety of elements in the organic light-emitting display device 100 and is made of a flexible material so as to be bendable. The flexible substrate 110 includes a display area DA, a non-display area NDA extending from the display area DA, a bending area BA extending from the non-display area NDA, and a pad area PA. In the display area DA, a display unit 120 is formed. The display unit 120 displays images thereon. The non-display area NDA is a part of areas that do not display images and is not bent. The bending area BA is a part of the areas that do not display images and the flexible substrate 110 is bent therein. In the pad area PA, a pad unit 190 is formed.

Referring to FIGS. 1A and 1B, the multi-buffer layer 150 is formed across the display area DA, the non-display area NDA, the bending area BA and the pad area PA on the flexible substrate 110. In the bending area BA, the multi-buffer layer 150 protects the plurality of wirings 140 from moisture or air that possibly permeates through the flexible substrate 110. The multi-buffer layer 150 may be formed of organic substances and inorganic substances stacked on one another alternately.

In the display area DA and a part of the non-display area NDA, the first insulation layer 130 is formed. The first insulation layer 130 is formed all over the display area DA and is extended to part of the non-display area NDA. The first insulation layer 130 is not formed in the remaining part of the non-display area, the bending area BA and the pad area PA. As the first insulation layer 130 is formed only in part of the non-display area NDA, cracks in a passivation layer 170 in the bending area BA can be suppressed. When the first insulation layer 130 is not formed on the bending area BA, stress exerted on the passivation layer 170 formed on the bending area BA is reduced. Thus, cracks in the passivation layer 170 formed in the bending area BA are significantly suppressed.

Referring to FIGS. 1A and 1B, the insulation layer 130 is formed in a zigzag pattern 160 in the non-display area NDA. The term "zigzag pattern" refers to a pattern having a series of small angled corners. The zigzag pattern 160 is formed to suppress cracks occurring in the passivation layer 170 formed thereon.

The plurality of wirings 140 is formed on the multi-buffer layer 150. The plurality of wirings 140 electrically connects the display unit 120 formed on the display area DA of the flexible substrate 110 to a drive circuit unit, a gate driver integrated circuit (IC), a data driver IC or the like, to thereby transmitting signals. In order to suppress cracks occurring in the wirings 140 when the flexible substrate 110 is bent, the wirings 140 are made of a conductive material with excellent flexibility.

The plurality of wirings 140 traverses the non-display area NDA and the bending area BA. At least a part of each of the plurality of wirings 140 in the bending area BA is extended obliquely relative to the bending direction. Each of the plurality of wirings 140 is extended linearly in the part of the non-display area NDA and then is extended in a pattern of repeated diamond shapes.

Referring to FIGS. 1A and 1B, in the non-display area NDA closer to the display area DA, the plurality of wirings 140 is formed on the first insulation layer, specifically on the zigzag pattern of the first insulation layer 130. The circle indicated by the dashed-dotted line of FIG. 1A illustrates the shape of the plurality of wirings 140 formed on the zigzag pattern 160 of the first insulation layer 130 as enlarged. As can be seen from the circuit of FIG. 1A, there is a step between the first insulation layer 130 and the multi-buffer layer 150 at the zigzag pattern 160 of the first insulation layer. It is also can be seen that the line 140 is formed on the zigzag pattern 160. For the purpose of simplicity, in the circle indicated by the dashed-dotted line of FIG. 1A, thickness of the wirings 140 is omitted therefrom.

In the circle indicated by the dashed-dotted line of FIG. 1A as enlarged, the line 140 having a diamond shape is formed on the first insulation layer 130 and on the side surface 162 of the first insulation layer 130. In addition, the line 140 is formed at a portion of the zigzag pattern 160. When the line 140 is formed at the portion of the zigzag pattern 160, cracks can be minimized at the step between the first insulation layer 130 and the multi-buffer layer 150, i.e., at the side surface 162 of the first insulation layer 130 and at the line where the side surface 162 of the first insulation layer 130 meets the multi-buffer layer 150. This is because, at the step, the line 140 has better step coverage and flexibility than the passivation layer 170.

Further, the first insulation layer 130 in the zigzag pattern 160 can further reduce stress that causes cracks in the passivation layer 170, compared to the first insulation layer in a linear pattern. Therefore, the frequency of occurrence of cracks in the passivation layer 170 becomes lower around the zigzag pattern 160. Further, even if a crack occurs in the passivation layer 170, the crack propagates along the zigzag pattern 160. Therefore, propagation of the crack in the passivation layer 170 is suppressed.

In the circle illustrated indicated by the dashed-dotted line of FIG. 1A as enlarged, the line 140 is formed in accordance with the zigzag pattern 160. The line 140 formed in accordance with the zigzag pattern 160 has a border parallel to the zigzag pattern 160. The line 140 has a larger contact area with the zigzag pattern 160 when it is formed in accordance with the zigzag pattern 160 than when it is not. The passivation layer 170 is formed across the flexible substrate 110 and is formed over the wirings 140. Accordingly, as the wirings 140 have a larger contact area with the zigzag pattern 160, the passivation layer 170 has a smaller contact area with the zigzag pattern. In other words, the larger contact area the line 140 with good step coverage and the zigzag pattern 160 have, the smaller contact area the passivation layer 170 with poor step coverage and the zigzag pattern 160 have. Accordingly, cracks occurring in the passivation layer 170 on the zigzag pattern 160 are suppressed.

In FIG. 1A, the side surface 162 of the first insulation layer 130 is perpendicular to the multi-buffer layer 150. However, the first insulation layer 130 may have a sloped surface at the zigzag pattern 160. When the first insulation layer 130 has a sloped side surface, the wirings 140 may be formed on the sloped surface.

In FIG. 1A, the zigzag pattern 160 is formed only in the non-display area NDA between the bending area BA and the display area DA. However, the first insulation layer 130 may also be formed in a zigzag pattern in the pad area PA in the same manner as in the non-display area NDA. That is, because stress is transferred to the pad area PA as well to cause cracks when the bending area BA is bent, by forming the zigzag pattern 160 of the first insulation layer 130 in the pad area PA, cracks occurring in the passivation layer 170 in the pad area PA can be reduced and the propagation of the cracks can be suppressed.

In FIGS. 1A and 1B, each of the plurality of wirings 140 has a diamond shape so that at least a part of each of the plurality of wirings 140 is extended obliquely relative to the bending direction. However, the shape of the plurality of wirings 140 is not limited thereto. More specifically, each of the plurality of wirings 140 may include a portion having at least one of a diamond shape, a triangular wave shape, a sinusoidal wave shape and a trapezoidal shape.

Although the plurality of wirings 140 have the same shape in FIGS. 1A and 1B, but it is merely illustrative. Each of the plurality of wirings 140 may have one of a diamond shape, a triangular wave shape, a sinusoidal wave shape and a trapezoidal shape Referring to FIG. 1B, the passivation layer 170 is formed on the first insulation layer 130, the multi-buffer layer 150 and the plurality of wirings 140 across the display area DA, the non-display area NDA and the bending area BA. Specifically, the passivation layer 170 is formed on the first insulation layer 130 in the part of the non-display area NDA and is formed directly on the plurality of wirings 140 in other areas. Specifically, the passivation layer 170 is formed on the multi-buffer layer 150 in an area from the zigzag pattern 160 in the non-display area NDA to the bending area and is formed directly on the plurality of wirings 140 in other areas. The passivation layer 170 is formed directly on the plurality of wirings 140 to protect the plurality of wirings 140 from moisture or air possibly permeating from the outside or physical impact.

The passivation layer 170 may be an inorganic film. However, such an inorganic film used for the passivation layer 170 is easily breakable in nature and less flexible than the plurality of wirings 140. When the bending area BA is bent, cracks may occur in the passivation layer 170 due to the stress generated in the bending area BA. Further, the cracks in the passivation layer 170 may propagate to the plurality of wirings 140 formed directly under the passivation layer 170, resulting in cracks in the plurality of wirings 140 as well. However, the zigzag pattern 160 of the first insulation layer 130 in the flexible organic light-emitting display device 100 according the exemplary embodiment of the present disclosure has more areas with reduced stress, which may cause less cracks in the passivation layer 170, compared to a linear pattern. Therefore, the frequency of occurrence of cracks in the passivation layer 170 becomes lower around the zigzag pattern 160. Further, even if a crack occurs in the passivation layer 170, the crack propagates along the zigzag pattern 160. Therefore, propagation of the cracks in the passivation layer 170 is suppressed.

Referring to FIG. 1B, the multi-buffer layer 150 is formed on the flexible substrate 110. On the multi-buffer layer 150 are formed an active layer 172 and a gate insulation layer 173. On the gate insulation layer 173 are formed a gate electrode 174 and an interlayer insulation layer 175. A source electrode 176 and a drain electrode 177 are electrically connected to the active layer 172 via contact holes formed in the gate insulation layer 173 and the interlayer insulation layer 175.

The thin-film transistor T is a coplanar thin-film transistor T including the active layer 172, the gate electrode 174, the source electrode 176, and the drain electrode 177. The coplanar thin-film transistor T has a structure in which the source electrode 176, the drain electrode 177, and the gate electrode 174 are formed above the active layer 172. Although the thin-film transistor T has a coplanar structure herein, the structure of the thin-film transistor T is not limited thereto but may have various structures.

Further, the thin-film transistor T illustrated in FIG. 1B is of a p-type thin-film transistor so that an anode 180 is connected to the drain electrode 177. However, when thin-film transistor T illustrated in FIG. 1B is of an n-type thin-film transistor, the anode 180 may be connected to the source electrode 176.

On the thin-film transistor T, the passivation layer 170 to protect the thin-film transistor T and an over coat layer 178 to flatten the portion over the thin-film transistor T are formed. The anode 180 connected to the drain electrode 177 via a contact hole in the passivation layer 170 and in the over coat layer, an organic light-emitting layer 182 formed on the anode 180, and a cathode 183 formed on the organic light-emitting layer 182. A reflective layer 179 is interposed between the over coat layer 178 and the anode 180 below the organic light-emitting layer 182. A bank 181 is formed on a side of the anode 180. On the cathode 183 is formed an encapsulation part 184. In FIG. 1B, the organic light-emitting element of a top-emission type is illustrated which includes the anode 180, the organic light-emitting layer 182 and the cathode 183 and in which light from the organic light-emitting layer 182 passes toward the cathode 183. However, an organic light-emitting element of a bottom emission type may be used in which light passes toward the anode 180.

In the display area DA of the flexible substrate 110, a connection part 142 is formed. The connection part 142 connects the wirings 140 to an element formed on the display area DA and is made of the same material as one of various conductive elements formed on the display unit 120. In FIG. 1B, the connection part 142 is made of the same material as the gate electrode 174.

The wirings 140 are made of the same material as one of various conductive elements formed in the display area DA. In FIG. 1B, the wirings 140 are made of the same material as the source electrode 176 and the drain electrode 177. The wirings 140 may be made of the same material from the display area DA to the bending area BA and may be produced in the same process.

The first insulation layer 130 in the non-display area NDA is made of the same material as one of various insulation layers formed in the display area DA. When the wirings 140 are made of the same material as the source electrode 176 and the drain electrode 177 as illustrated in FIG. 1B, the first insulation layer 130 is made of the same material as the gate insulation layer 173 and the interlayer insulation layer 175 formed in the display area DA of the flexible substrate 110.

The first insulation layer 130 is patterned so that it is formed in the display area DA and the part of the non-display area NDA. The first insulation layer 130 is spaced apart from the display area DA by 30 μm or more in one embodiment. Only when the zigzag pattern 160 is spaced apart from the display area DA by 30 μm or more, the encapsulation part 184 in the display area DA can be patterned with sufficient width, and sufficient margin can be obtained between the encapsulation part 184 and the zigzag pattern 160.

Although the wirings 140 are made of the same material as the source electrode 176 and the drain electrode 177 in FIG. 1B, it is merely illustrative. The wirings may be made of the same material as one of the gate insulation layer 173, the source electrode 176, the drain electrode 177, the reflective layer 179, and the cathode 183.

Although the first insulation layer 130 is made of the same material as the gate insulation layer 130 and the interlayer insulation layer 175 in FIG. 1B, it is merely illustrative. The first insulation layer 130 may be made of the same material as one of the multi-buffer layer 150, the gate insulation layer 173, and the interlayer insulation layer 175.

FIG. 1C(a), (b) and (c) are enlarged plane views illustrating a zigzag pattern and cracks in an organic light-emitting display device according to an exemplary embodiment of the present disclosure. In FIG. 1C (a), (b) and (c), for the convenience of illustration, descriptions will be made with reference to the passivation layer 170 of FIG. 1B.

FIG. 1C (a) is an enlarged view of the zigzag pattern 160 of the first insulation layer 130 in the non-display area NDA of FIG. 1B, illustrating the reduced occurrence rate of cracks in the passivation layer.

The non-display area NDA is disposed next to the bending area BA and is not bent. However, the passivation layer 170 in the non-display area NDA is influenced by the stress from the bending area BA when the bending area BA is bent. Therefore, cracks may occur even in the passivation layer 170 in the non-display area NDA due to the stress caused by the bending. In the organic light-emitting display device 100 according to an exemplary embodiment of the present disclosure, the zigzag pattern 160 suppresses cracks occurring in the passivation layer 170.

Referring to FIG. 1C (a), point A is located on the zigzag pattern 160 where the direction of the zigzag pattern 160 is changed, and point B is located where the zigzag pattern 160 is oblique relative to the bending direction. The total stress on point A is equal to that of point B. However, crack inducing stress exerted on point A is different from that of point B. Accordingly, the frequency or probability of occurrence of cracks in the passivation layer 170 at point A is different from that of point B. The crack inducing stress exerted on point A in the passivation layer 170 is indicated by the arrows at both sides of point A in FIG. 1C (a). That is, cracks occurring in the passivation layer 170 may be different, depending not only the total stress exerted on the passivation layer 170 but also on the direction of the stress. The passivation layer 170 is very vulnerable to the stress at point A because of the lower step coverage at the step and the shim possibly formed at the lower end of the step.

When the bending direction is parallel to the directions indicated by the arrows at point A, the crack inducing stress exerted on the passivation layer 170 is maximized at point A. That is, when the bending direction is parallel to the arrows at point A, the crack inducing stress exerted on the passivation layer 170 approximates the total stress caused by the bending. When the crack inducing stress exerted on the passivation layer 170 exceeds a threshold value, cracks occur in the passivation layer 170 formed at point A.

The direction of the crack inducing stress exerted on the passivation layer 170 at point B is indicated by the arrows at both sides of point B in diagram (a) of FIG. 1C. When the bending direction is not parallel to the arrows at point B but is oblique, the total stress exerted on point B by the bending is not changed compared to that of point A. However, the crack inducing stress exerted on the passivation layer 170 at point B decreases with the slope of the zigzag pattern 160 relative to the bending direction. Accordingly, at point B, the crack inducing stress that causes cracks in the passivation layer 170 is decreased, and thus the frequency of occurrence of cracks in the passivation layer 170 is reduced, despite low step coverage of the passivation layer 170 and the existence of the shim.

The zigzag pattern 160 illustrated in FIG. 1C (a) decreases the number of points where crack inducing stress is exerted maximally, such as point A, and increases the number of points where occurrence of cracks is reduced, such as point B. That is, the zigzag pattern 160 has more portions with reduced crack inducing stress on the passivation layer 170 than a linear pattern. Therefore, the frequency of occurrence of cracks in the passivation layer 170 becomes lower around the zigzag pattern 160.

Hereinafter, descriptions will be made in detail on how the propagation of cracks in the passivation layer 170 can be suppressed by the zigzag pattern 160.

FIG. 1C (b) is an enlarged plane view illustrating the direction in which a crack line is extended in the zigzag pattern of the flexible organic light-emitting display device according to the exemplary embodiment of the present disclosure. Referring to FIG. 1C (b), the first insulation layer 130 and the zigzag pattern 160 of the first insulation layer 130 are shown. Point C indicates the origin of a crack in the passivation layer 170. Line D-D' is drawn with points where the crack inducing stress is highest in the passivation layer 170 with respect to the origin of the crack. Wirings C-E and C-E' are parallel to the zigzag pattern 160.

The crack in the passivation layer 170 propagates to a position vulnerable to the stress. The areas around line D-D' which are perpendicular to the bending direction may receive most of the crack inducing stress with respect to point C. In the organic light-emitting display device 100 according to an exemplary embodiment of the present disclosure, the first insulation layer 130 is patterned in the directions parallel to wirings C-E and C-E', instead of line D-D'. Therefore, there is no step in the areas around line D-D'. Instead, there are steps between the first insulation layer 130 and the multi-buffer layer 150 in the areas around wirings C-E and C-E' parallel to the zigzag pattern 160. In other words, since the first insulation layer 130 is formed in the zigzag pattern 160, the areas around the zigzag pattern 160 are more vulnerable to the stress than the areas around line D-D'. As mentioned earlier, however, the points on the zigzag pattern 160 receive the crack inducing stress in the passivation layer 170 less than point C. Thus, even if a crack occurs in the passivation layer 170 at point C, the crack cannot propagate easily. That is to say, when a crack occurs in the passivation layer 170, the crack in the passivation layer 170 propagates along the zigzag pattern 160. In addition, the zigzag pattern 160 is longer than a linear pattern. Thus, the distance from the origin of the crack having occurred in the passivation layer 170 the plurality of wirings 150 is also increased. Therefore, even when a crack occurs in the passivation layer 170, the crack propagates to the plurality of wirings 140 less often.

FIG. 1C (c) is an enlarged plane view illustrating the shape of the zigzag pattern of a flexible organic light-emitting display device according to an exemplary embodiment of the present disclosure. In FIG. 1C (c), the shape of the zigzag pattern 160 by which cracks occurring in the passivation layer 170 can be suppressed and reduce the propagation of the cracks.

Referring to FIG. 1C (c), a portion of the zigzag pattern 160 has the slope of 0° relative to the bending direction. The angle θ may be between 10° and 80° in one embodiment. When the wirings of the zigzag pattern 160 are formed at an angle between 10° and 80°, the crack inducing stress in the passivation layer 170 is reduced. In one embodiment, the angle θ may be between 60° and 80°. If the angle θ is below 60°, the frequency of occurrence of cracks in the passivation layer 170 cannot be sufficiently reduced. If the angle θ is above 80°, the zigzag pattern 160 cannot impede the propagation of the cracks having occurred in the passivation layer 170.

Figure 1D:
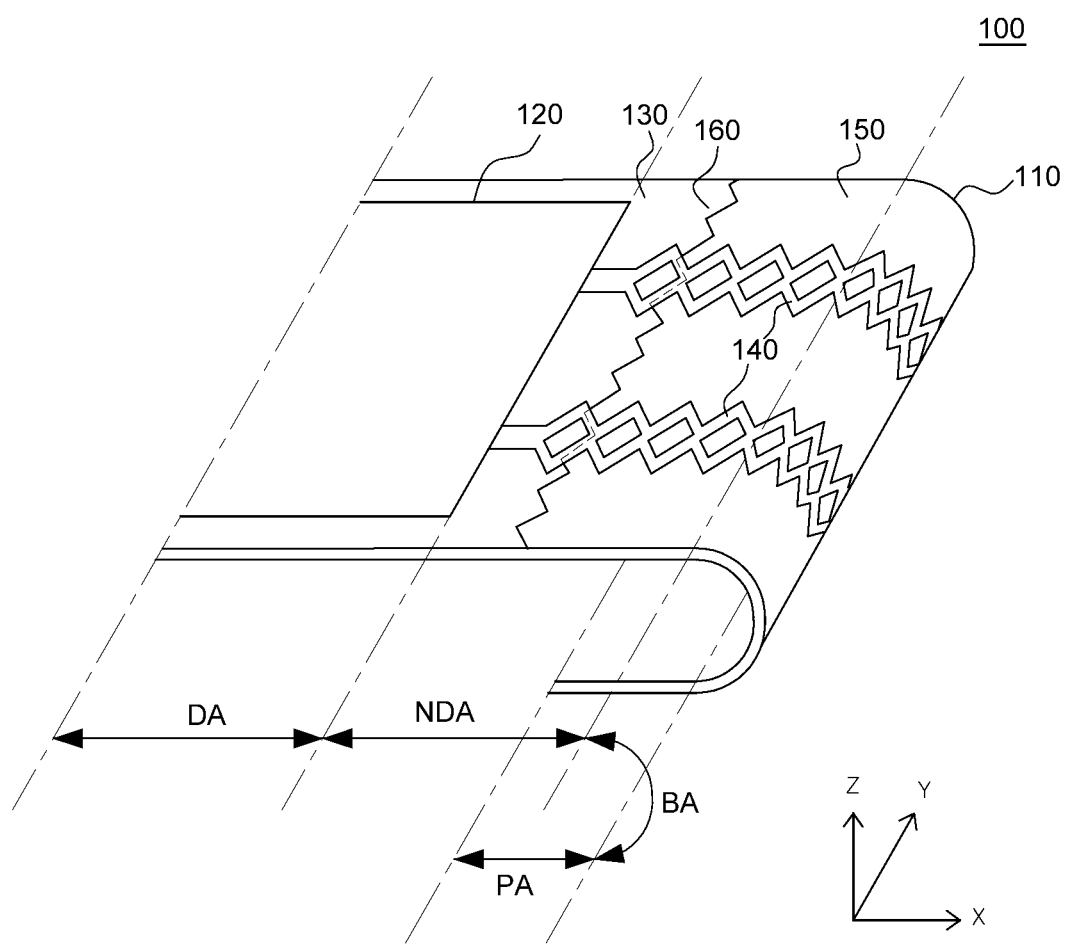
FIG. 1D is a schematic perspective view illustrating the wirings and the first insulation layer when the bending area of the flexible organic light-emitting display device according to the exemplary embodiment of the present disclosure is bent.

FIG. 1D is a schematic perspective view illustrating the wirings and the first insulation layer when the bending area of the flexible organic light-emitting display device according to the exemplary embodiment of the present disclosure is bent. The flexible organic light-emitting display device 100 illustrated in FIG. 1D is substantially identical to the flexible organic light-emitting display device 100 illustrated in FIG. 1A except that the bending area BA of the flexible substrate 110 is bent. Referring to FIG. 1D, the bending area BA of the flexible substrate 110 is bent, and the stress caused by the bending reaches the non-display area NDA. However, the cracks occurring in the passivation layer 160 are reduced by in the zigzag pattern 160 of the first insulation layer 130. Further, even if cracks occur in the passivation layer, they cannot propagate to the plurality of wirings 140.

In FIGS. 1A to 1D, the flexible substrate 110 includes several areas. However, the flexible substrate 110 can be described as comprising of a non-bending area and a bending area on the periphery of the non-bending area. For example, the first insulation layer 130 may be in the non-bending area. The first insulation 130 layer may have the zigzag pattern between the non-bending area and the bending area of the flexible substrate 110. The zigzag pattern of the first insulation layer 130 may be formed obliquely relative to the boundary between the non-bending area and the bending area. In this connection, as the angle made by the zigzag pattern and the boundary between the non-bending area and the bending area increases, the frequency of occurrence of cracks in the passivation layer 170 decreases. Further, when a crack occurs in the passivation layer 170 formed on the first insulation layer 130, the zigzag pattern may have a shape that guides the crack so that it propagates along the zigzag pattern. For example, the shape of the zigzag pattern to guide the propagation of a crack may have points at its corners spaced apart from one another with sufficient distance there between. This is to prevent that the points at the corners are connected to one another so that the crack occurring in the passivation layer propagates.

It is to be understood that the expressions to refer to various areas and the expression "zigzag pattern" used in the flexible organic display device according to the exemplary embodiment of the present disclosure are merely to facilitate understanding of the present disclosure. Accordingly, the expressions for defining the areas or patterns of the first insulation layer are not particularly limited, as long as the effect of the first insulation layer and the zigzag pattern can be achieved.

Figure 2A:
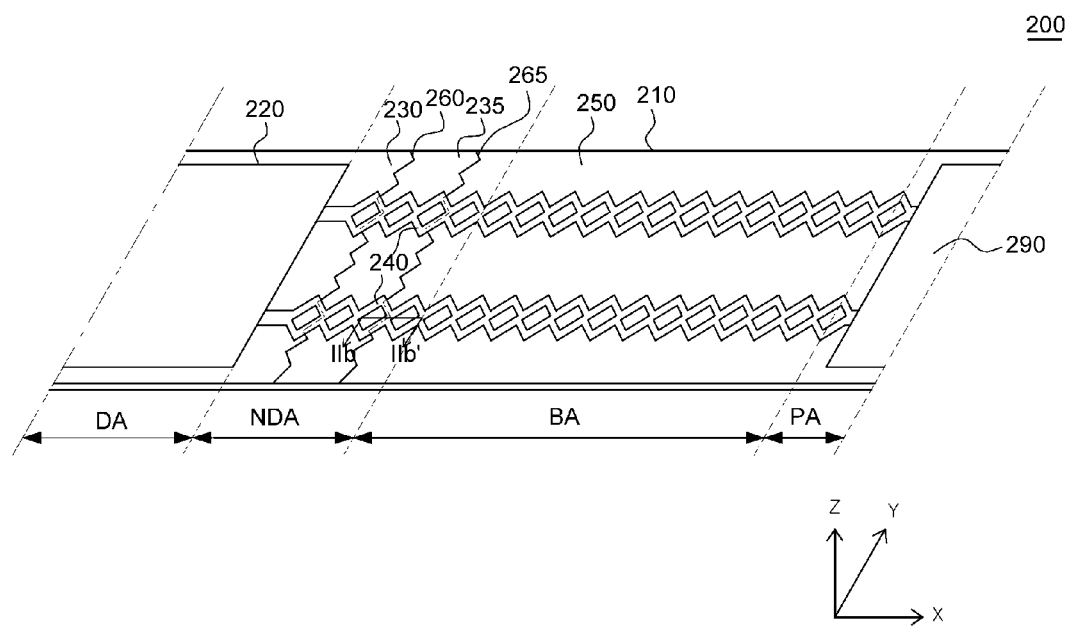
FIG. 2A is a schematic perspective view of a flexible organic light-emitting display device according to an exemplary embodiment of the present disclosure before a bending area is bent, illustrating the shapes of wirings, a first insulation layer and a second insulation layer.
Figure 2B:
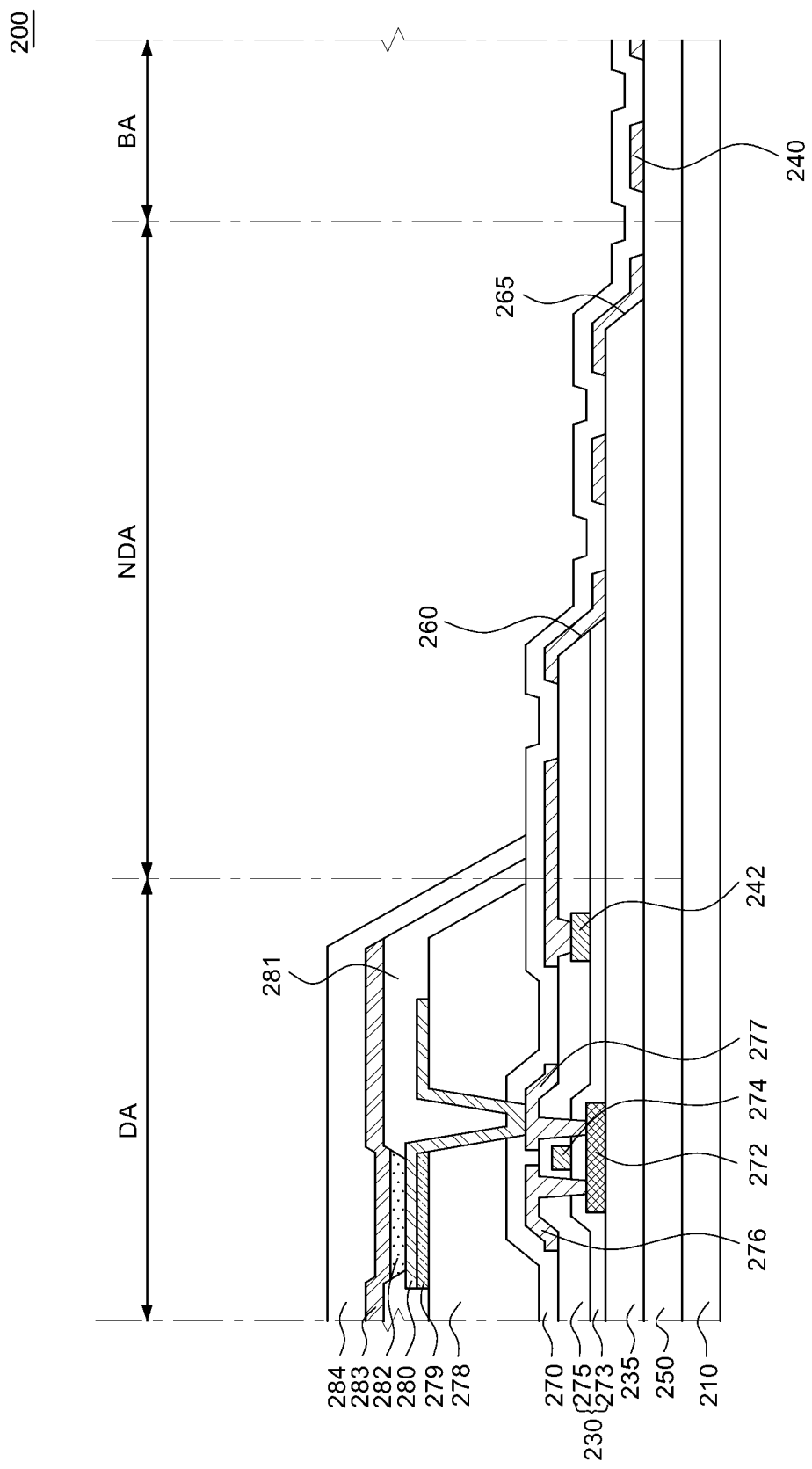
FIG. 2B is a cross-sectional view of a flexible organic light-emitting display device taken along line IIb-IIb' of FIG. 2A.

FIG. 2A is a schematic perspective view of a flexible organic light-emitting display device according to an exemplary embodiment of the present disclosure before a bending area is bent, illustrating the shapes of wirings, a first insulation layer and a second insulation layer. FIG. 2B is a cross-sectional view of a flexible organic light-emitting display device taken along line IIb-IIb' of FIG. 2A.

The flexible organic light-emitting display device 200 illustrated in FIGS. 2A and 2B includes a flexible substrate 210, a display unit 220, a first insulation layer 230, a second insulation layer 235, a plurality of wirings 240, a multi-buffer layer 250, a passivation layer 270, an anode 280, light-emitting layer 282, cathode 283, and encapsulation part 284. The flexible substrate 210, the display unit 220, the first insulation layer 230, the multi-buffer layer 250, the passivation layer 270, an anode 280, light-emitting layer 282, cathode 283, and encapsulation part 284 illustrated in FIGS. 2A and 2B are substantially identical to the flexible substrate 110, the display unit 120, the first insulation layer 130, the multi-buffer layer 150, the passivation layer 170, the anode 180, the light-emitting layer 182, the cathode 183, and the encapsulation part 184 illustrated in FIGS. 1A and 1B. Therefore, detailed descriptions on the like elements will not be made.

The flexible organic light-emitting display device 200 illustrated in FIGS. 2A and 2B includes a second insulation layer 235 formed between the multi-buffer layer 250 and the first insulation layer 230. The second insulation layer 235 is formed in the display area DA and in a part of the non-display area NDA so that cracks in the plurality of wirings 240 and the passivation layer 270 in the bending area BA are suppressed. The second insulation layer 235 is formed in the display area DA and is extended to the part of the non-display area NDA. The second insulation layer 235 is not formed in the bending area and the pad area PA. The second insulation layer 235 is formed in a zigzag pattern in the non-display area NDA between the zigzag pattern 260 of the first insulation layer 230 and the bending area BA.

As the second insulation layer 235 is removed from the bending area BA and the non-display area NDA, the thickness of the flexible organic light-emitting display device 200 becomes thinner in the bending area BA. Accordingly, cracks are less likely to occur in the plurality of wirings 240 and the passivation layer 270 in the bending area BA.

Further, the zigzag pattern 265 of the second insulation layer 235 suppresses the cracks occurring in the passivation layer 270 formed on the second insulation layer 235 and the multi-buffer layer 250 and impedes cracks having occurred from being connected to one another.

The zigzag pattern 260 of the first insulation layer 230 is spaced apart from the zigzag pattern 265 of the second insulation layer 235 by at least 10 μm distance in one embodiment. The width of the zigzag pattern 265 of the second insulation layer 235 may be in the order of 10 μm. The zigzag pattern 260 of the first insulation layer 230 and the zigzag pattern 265 of the second insulation layer 235 should not overlap each other, and thus the zigzag pattern 260 of the first insulation layer 230 is spaced apart from the zigzag pattern 265 of the second insulation layer 235 by at least 10 μm distance in one embodiment. If the zigzag pattern 260 of the first insulation layer 230 is spaced apart from the zigzag pattern 265 of the second insulation layer 235 by less than 10 μm, the two steps in the zigzag patterns 260 and 265 work as substantially one step. If the steps are too large, the thickness of the passivation layer 270 formed on the side surfaces of the first insulation layer 230 and the second insulation layer 235 becomes too thin due to the low step coverage of the passivation layer 270. Accordingly, cracks may increasingly occur in the passivation layer 270. In addition, the widths of the zigzag patterns 260 and 265 may be between 1 μm and 10 μm in one embodiment. If the widths are below 1 μm, sufficient distance between the passivation layer 270 and the plurality of wirings 240 is not obtained so that a crack in the passivation layer 270 cannot be impeded from propagating. Further, if the widths exceed 10 μm, the zigzag pattern 260 cannot be sufficiently spaced apart from the zigzag pattern 265. If the widths of the zigzag patterns 260 and 265 are 10 μm or larger, the zigzag patterns 260 and 265 may overlap each other or may be too close to each other. If the zigzag patterns 260 and 265 overlap each other, the steps become too deep in the zigzag patterns 260 and 265. Therefore, cracks may increasingly occur in the wirings 240 or the passivation layer 270 formed on the zigzag patterns 260 and 265 by a shim or the like.

Referring to FIGS. 2A and 2B, the zigzag pattern 260 of the first insulation layer 230 is substantially identical to the zigzag pattern 265 of the second insulation layer 235. This means that if the zigzag pattern 260 of the first insulation layer 230 and the zigzag pattern 265 of the second insulation layer 235 are folded along an imaginary line, they are matched. If the same mask is used in the process of patterning the first insulation layer 230 and in the process of the patterning the second insulation layer 235, the zigzag pattern 260 and the zigzag pattern 265 can be substantially identical to each other, thereby reducing the manufacturing cost.

The multi-buffer layer 250 is formed of inorganic films and organic films stacked on one another alternately. Like the multi-buffer layer 250, the second insulation layer 235 is also formed of inorganic films and organic films stacked on one another alternately. In FIG. 2B, the multi-buffer layer 250 and the second insulation layer 235 are illustrated as different layers. However, both of them are formed of inorganic films and organic films stacked on one another alternately, with the difference that the second insulation layer 235 have the zigzag pattern 265 in the non-display area NDA. Referring to FIG. 2B, the second insulation layer 235 also has a sloped surface at the zigzag pattern 265. The wirings 240 are formed on the slope surface of the second insulation layer 235.

Figure 3:
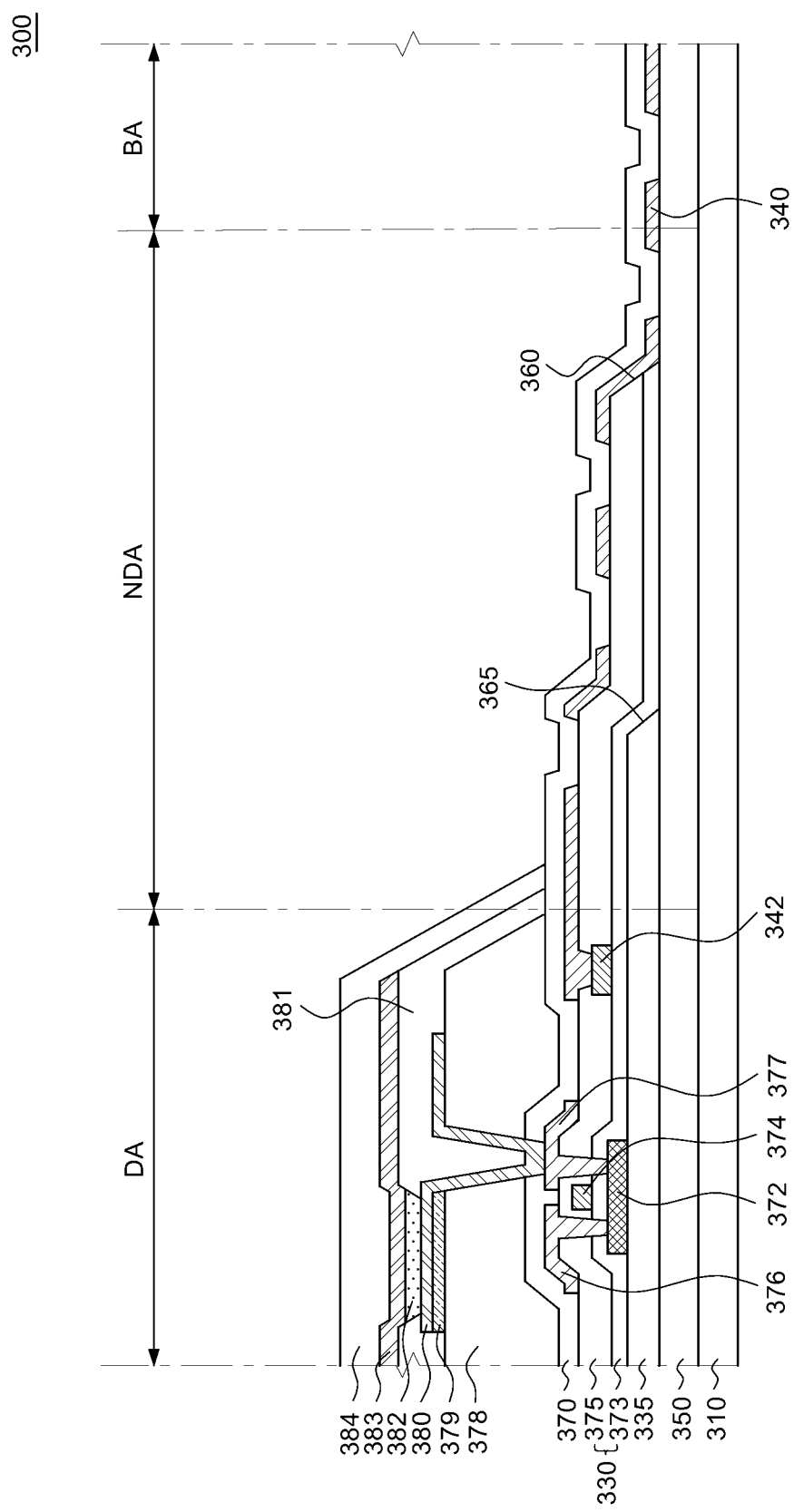
FIG. 3 is a cross-sectional view illustrating an example of a structure in which a first insulation layer covers a second insulation layer having a zigzag pattern in a flexible organic light-emitting display device according to an exemplary embodiment of the present disclosure.

FIG. 3 is a cross-sectional view illustrating an example of a structure in which a first insulation layer covers a second insulation layer having a zigzag pattern in a flexible organic light-emitting display device according to an exemplary embodiment of the present disclosure. The flexible organic light-emitting display device 300 illustrated in FIG. 3 is substantially identical to the flexible organic light-emitting display device 200 illustrated in FIG. 2A except that the positions of the zigzag patterns of the first insulation layer 230 and the second insulation layer 235.

Referring to FIG. 3, the second insulation layer 335 is formed on a multi-buffer layer 350 and includes a zigzag pattern 365 in a part of a non-display area NDA. Since the first insulation layer 330 covers the second insulation layer 335 and the zigzag pattern 365 of the second insulation layer 335, it has a step at the position of the zigzag pattern 365 of the second insulation layer 335. The first insulation layer 330 includes a gate insulation layer 373 and an interlayer insulation layer 375. The first insulation layer 330 includes a zigzag pattern 360 between the zigzag pattern 365 of the second insulation layer 335 and the bending area BA.

The wirings 340 and a passivation layer 370 are formed on the first insulation layer 330 from a display area DA to the zigzag pattern 360 of the first insulation layer 330. The wirings 340 and a passivation layer 370 are formed on the multi-buffer layer 350 beyond the zigzag pattern 360. The frequency of occurrence of cracks in the passivation layer 370 is reduced by the structure illustrated in FIG. 3. The principle and effect of suppressing the propagation of cracks are the same as described above.

The anode 380 connected to the drain electrode 377 via a contact hole in the passivation layer 370 and in the over coat layer, an organic light-emitting layer 382 formed on the anode 380, and a cathode 383 formed on the organic light-emitting layer 382. A reflective layer 379 is interposed between the over coat layer 378 and the anode 380 below the organic light-emitting layer 382. A bank 383 is formed on a side of the anode 380. On the cathode 383 is formed an encapsulation part 384.

Figure 4:
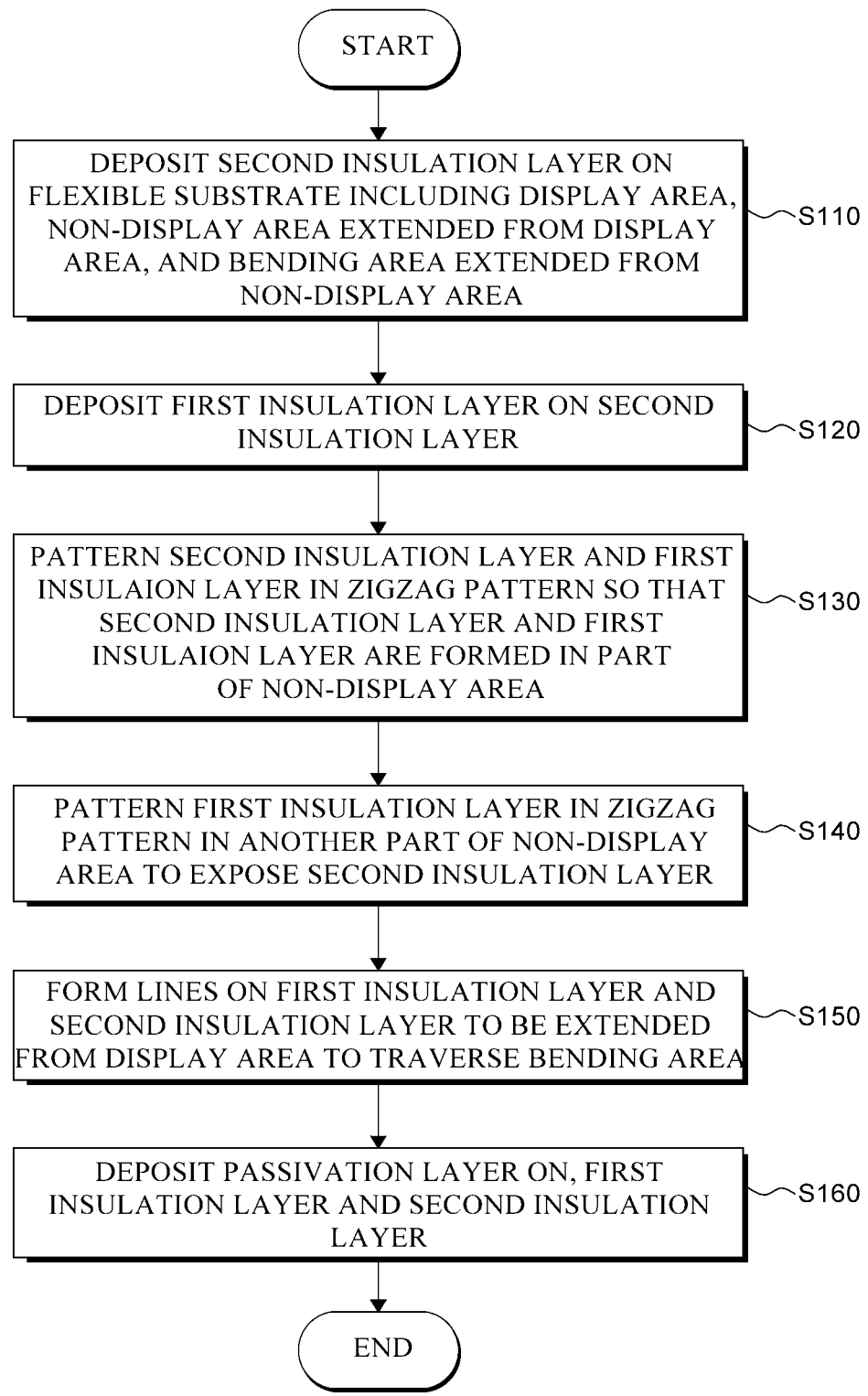
FIG. 4 is a flowchart illustrating a method of fabricating an organic light-emitting display device according to an exemplary embodiment of the present disclosure.

FIG. 4 is a flowchart illustrating a method of fabricating an organic light-emitting display device according to an exemplary embodiment of the present disclosure. FIG. 4 illustrates processes of forming elements in the non-display area NDA and the bending area BA in the flexible organic light-emitting display device 100 illustrated in FIG. 1A. Other elements than the elements in the non-display area NDA and the bending area BA, such as a display unit, may be formed as illustrated in FIG. 1B, for example.

Initially, a second insulation layer is deposited on a flexible substrate including a display area, a non-display area extended from the display area, and a bending area extended from the non-display area (S110).

The flexible substrate may be made of a flexible insulation material. Available flexible insulating material may include polyimide (PI) resin, polyetherimide (PEI) resin, polyethyelene terephthalate (PET) resin, polycarbonate (PC) resin, polymethylmethacrylate (PMMA) resin, polystyrene (PS) resin, styrene-acrylonitrile copolymer (SAN) resin, and silicon-acryl resin. The second insulation layer may be a part of the multi-buffer layer in which organic films and inorganic films are deposited on one another alternately.

A first insulation layer is deposited on the second insulation layer (S120). The first insulation layer may be made of the same material as the interlayer insulation film or the gate insulation film and may be produced in the same process.

The second insulation layer and the first insulation layer are patterned in zigzag patterns so that the second insulation layer and the first insulation layer are formed in part of the non-display area (S130). The first insulation layer and the second insulation layer may be patterned, for example, in a photoresist process using a mask having a zigzag pattern formed therein.

The first insulation layer is patterned in a zigzag pattern in the remaining part of the non-display area so that the second insulation layer is exposed (S140). The patterning of the first insulation layer so that the second insulation is exposed includes removing only the first insulation layer in a photoresist process using a mask, leaving the second insulation layer. By patterning the first insulation layer in a zigzag pattern so that the second insulation layer is exposed, the first insulation layer has the zigzag pattern on the second insulation layer in the non-display area.

On the first insulation layer and second insulation layer, wirings are formed extending from the display area to traverse the bending area (S150). The wirings are also formed on the sloped surface of the zigzag pattern. Wirings are formed on the first insulation layer between the zigzag pattern of the first insulation layer and the zigzag pattern of the second insulation layer, and are formed on the multi-buffer layer between the zigzag pattern of the second insulation layer and the bending area. Further, the wirings on the zigzag pattern of the first insulation layer has at least one of a diamond shape, a triangular wave shape, a sinusoidal wave shape and a trapezoidal shape. The wirings may also be formed on along the zigzag pattern.

A passivation layer is deposited on the first insulation layer and the second insulation layer (S160). The passivation layer covers the wirings, the first insulation layer and the second insulation layer. Accordingly, the passivation layer is also formed on the sloped surface of the zigzag pattern of the first insulation layer. The passivation layer may be made of inorganic films and organic films stacked on one another alternately or may be made solely of organic films stacked on one another.

Additionally, the bending area of the flexible substrate is bent. Even when the bending area is bent, by virtue of the zigzag pattern of the first insulation layer, the frequency of occurrence of cracks in the passivation layer formed on the insulation layer is reduced, and cracks, if having occurred, are not connected to one another.

Figure 5:
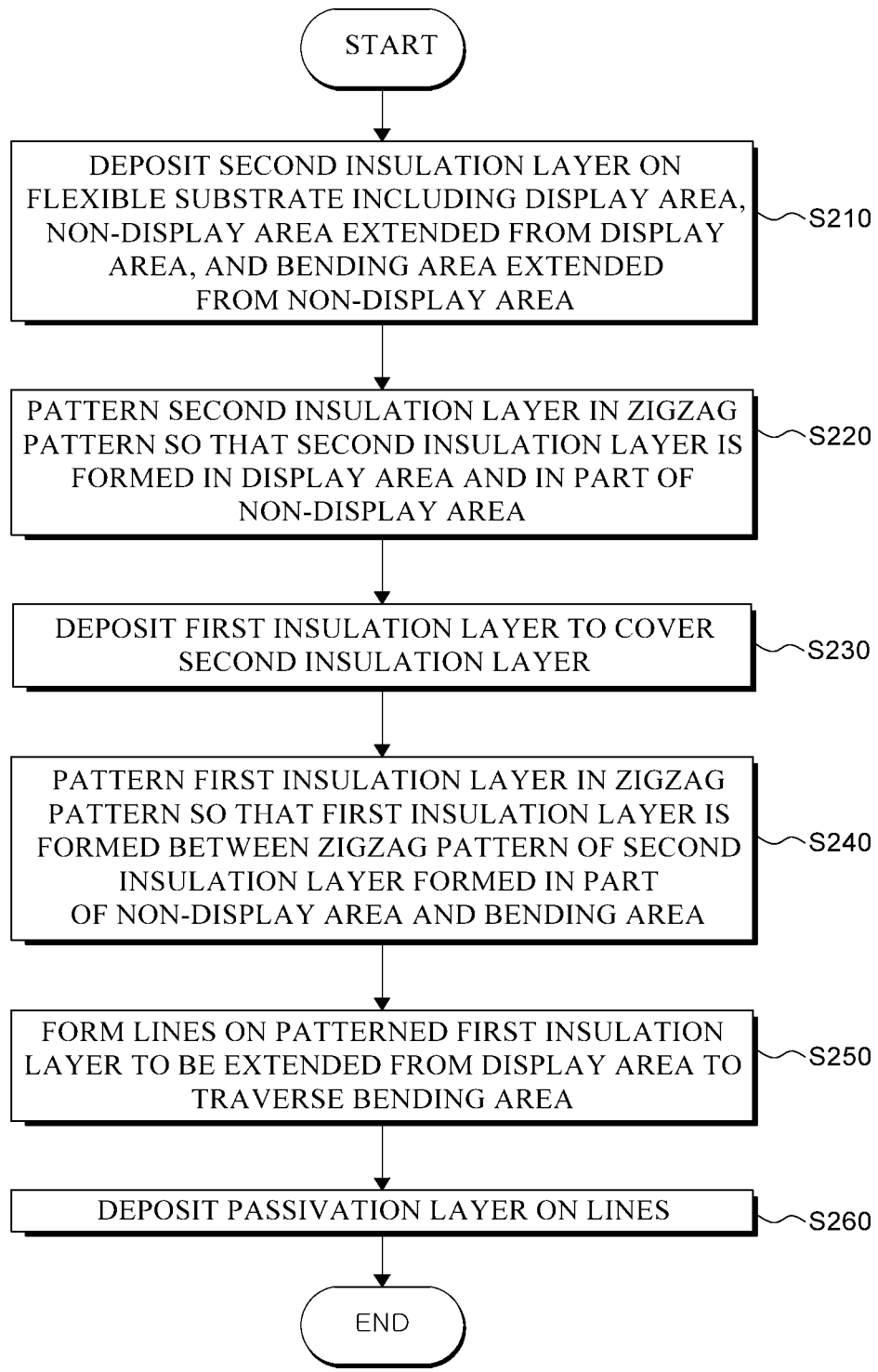
FIG. 5 is a flowchart illustrating a method of fabricating a flexible organic light-emitting display device in which a first insulation layer covers the second insulation layer having a zigzag pattern.

FIG. 5 is a flowchart illustrating a method of fabricating a flexible organic light-emitting display device in which a first insulation layer covers the second insulation layer having a zigzag pattern.

Initially, a second insulation layer including a display area, a non-display area extended from the display area, and a bending area extended from the non-display area is deposited on a flexible substrate (S210). The second insulation layer may be made of inorganic films and organic films stacked on one another plural times alternately and may be a part of the multi-buffer layer.

The second insulation layer is patterned in a zigzag pattern to be formed in the display area and a part of the non-display area (S220). A part of the second insulation layer is removed from the part of the non-display area using a mask having a zigzag pattern therein.

Then, the first insulation layer is deposited to cover the second insulation layer (S230). The first insulation layer may include a gate insulation layer, an interlayer insulation layer or both of the gate insulation layer and the interlayer insulation layer. The first insulation layer is formed to cover a step creased by patterning the second insulation layer.

The first insulation layer is patterned in a zigzag pattern so that the first insulation layer is formed between the zigzag pattern of the second insulation layer formed in part of the non-display area and the bending area (S240). The patterning of the first insulation layer between the zigzag pattern of the second insulation layer and the bending area is performed in a photoresist process using a mask. By patterning the first insulation layer in a zigzag pattern, the first insulation layer has the zigzag pattern on the multi-buffer layer in the non-display area.

On the patterned first insulation layer, wirings are formed extending from the display area to traverse the bending area (S250). Further, a passivation layer is deposited on the wirings (S260). Additionally, the bending area of the flexible substrate is bent. The steps S250 and S260 are substantially identical to the steps S150 and S160 described above.

In short, in a flexible organic light-emitting display device fabricated by a method according to an exemplary embodiment of the present disclosure, by virtue of zigzag patterns of a first insulation layer and a second insulation layer, cracks in a passivation layer are suppressed, and cracks, if having occurred, are not connected to one another.

Hereinafter, various characteristics of the flexible organic display-emitting device according to the present invention will be described.

According to another characteristic of the present disclosure, a portion of the flexible substrate in the bending area is bent in a particular direction.

According to still another characteristic of the present disclosure, a part of the zigzag pattern is at an angle between 60° and 80° with respect to the direction.

According to still another characteristic of the present disclosure, the line extends in an oblique manner relative to the particular direction.

According to still another characteristic of the present disclosure, the line is formed in a corresponding manner to the zigzag pattern on the first insulation layer in the part of the non-display area.

According to still another characteristic of the present disclosure, the line comprises a continuous series of diamond-shape wirings, triangular-shape wirings, sine-wave-shape wirings, trapezoidal-shape wirings or combinations thereof.

According to still another characteristic of the present disclosure, the flexible substrate further comprises a pad area extending from the bending area, According to still another characteristic of the present disclosure, the device further comprises a pad unit in the pad area, and the line is electrically connected to the pad unit.

According to still another characteristic of the present disclosure, the zigzag pattern is spaced apart from the display area by at least 30 μm.

According to still another characteristic of the present disclosure, the first insulation layer has a sloped face at the zigzag pattern, and the line is formed on the sloped face.

According to still another characteristic of the present disclosure, the device further comprises: a second insulation layer on the substrate in the display area thereof and a part of the non-display area thereof, the second insulation layer formed between the flexible substrate and the first insulation layer, the second insulation layer comprises a second zigzag pattern between the zigzag pattern of the first insulation layer and the bending area, the second zigzag pattern being substantially identical to the zigzag pattern of the first insulation layer.

According to still another characteristic of the present disclosure, the second insulation layer has a second sloped face at the second zigzag pattern, wherein the line is formed on the second sloped face.

According to still another characteristic of the present disclosure, the zigzag pattern of the first insulation layer is spaced apart from the second zigzag pattern by at least 10 μm.

According to still another characteristic of the present disclosure, the thin-film transistor comprises an active layer, a gate electrode, a source electrode and a drain electrode, the thin-film transistor second comprises a gate insulation layer formed between the active layer and the gate electrode, and an interlayer insulation layer formed between the gate electrode and the source electrode, and between the gate electrode and the drain electrode.

According to still another characteristic of the present disclosure, the first insulation layer and the interlayer insulation layer are formed of the same material via the same process.

According to still another characteristic of the present disclosure, the line is formed of the same material as the source electrode and/or the drain electrode via the same process.

Hereinafter, various characteristics of the method of fabricating a flexible organic display-emitting device according to the present disclosure will be described.

According to still another characteristic of the present disclosure, the line is formed on the first insulation layer between the zigzag pattern of the first insulation layer and the zigzag pattern of the second insulation layer.

According to still another characteristic of the present disclosure, the zigzag pattern is configured such that a propagation of a crack occurred in the passivation layer is induced to follow a direction of the zigzag pattern.

According to still another characteristic of the present disclosure, the zigzag pattern is configured such that an angle between the zigzag pattern and a border line between the non-bending area and the bending area increases.

Hereinafter, various characteristics of the method of fabricating a flexible organic light-emitting display device according to the present disclosure will be described.

According to another characteristic of the present disclosure, the line is formed on the second insulation layer, between the first and second zigzag patterns.

The present invention has been described in more detail with reference to the exemplary embodiments, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

What is claimed is:

1. A flexible organic light-emitting display device, comprising:
   a flexible substrate comprising a display area, a non-display area adjacent to the display area, and a bending area adjacent to the non-display area;
   a display unit on the display area of the flexible substrate, the display unit comprising a thin-film transistor and an organic light-emitting element;
   a first insulation layer on the display area of the flexible substrate and a part of the non-display area;
   a plurality of wirings on the first insulation layer in the part of the non-display area, electrically connected to the display unit, extended over the non-display area and the bending area along a first direction; and
   a passivation layer on the first insulation layer and the plurality of wirings,
   wherein the first insulation layer on the part of the non-display area has a zigzag pattern along a second direction that crosses the first direction.

2. The device according to claim 1, wherein a portion of the flexible substrate in the bending area is bent to a particular direction.

3. The device according to claim 2, wherein a part of the zigzag pattern has an angle between 60° and 80° with respect to the particular direction.

4. The device according to claim 2, wherein the plurality of wirings diagonally extend to the particular direction.

5. The device according to claim 4, wherein a part of the plurality of wirings in the part of the non-display area have the same shape according to the zigzag pattern of the first insulation layer.

6. The device according to claim 1, wherein the plurality of wirings have a continuous series of diamond-shape, triangular-shape, sine-wave-shape, trapezoidal-shape or combinations thereof.

7. The device according to claim 1, wherein the flexible substrate further comprises a pad area extended from the bending area, wherein the pad area has a pad unit, the pad unit is electrically connected to the plurality of wirings.

8. The device according to claim 1, wherein the zigzag pattern is spaced apart from the display area by at least 30 μm.

9. The device according to claim 1, wherein the first insulation layer has a first sloped face at the zigzag pattern, wherein the plurality of wirings are formed on the first sloped face.

10. The device according to claim 1, further comprising:
    a second insulation layer on the display area and the part of the non-display area of the flexible substrate, disposed between the flexible substrate and the first insulation layer,
    wherein the second insulation layer comprises a second zigzag pattern between the zigzag pattern of the first insulation layer and the bending area, the second zigzag pattern being substantially identical to the zigzag pattern of the first insulation layer.

11. The device according to claim 10, wherein the second insulation layer has a second sloped face at the second zigzag pattern, wherein the plurality of wirings are formed on the sloped face at the second zigzag pattern.

12. The device according to claim 10, wherein the zigzag pattern of the first insulation layer is spaced apart from the second zigzag pattern by at least 10 μm.

13. The device of claim 1, wherein the thin-film transistor comprises an active layer, a gate electrode, a source electrode and a drain electrode, the thin-film transistor further comprising:
    a gate insulation layer formed between the active layer and the gate electrode; and an interlayer insulation layer disposed between the gate electrode and the source electrode, and between the gate electrode and the drain electrode.

14. The device according to claim 13, wherein the first insulation layer and the interlayer insulation layer are formed of a same material via a same process.

15. The device according to claim 13, wherein the plurality of wirings are formed of a same material as the source electrode and a drain electrode via the same process.

16. A flexible organic light-emitting display device, comprising:
- a flexible substrate comprising a non-bending area and a bending area adjacent to the non-bending area;
- a first insulation layer on the non-bending area of the flexible substrate;
- a plurality of wirings on the first insulation layer extended over the bending area along a first direction; and
- a passivation layer on the first insulation layer,
- wherein the first insulation layer has a zigzag pattern disposed between the non-bending area and the bending area along a second direction that crosses the first direction, the zigzag pattern reducing a frequency of occurrence of cracks in the passivation layer.

17. The device according to claim 16, wherein the zigzag pattern induces a propagation of cracks occurred in the passivation layer.

18. The device according to claim 16, wherein the zigzag pattern reduces a frequency of occurrence of cracks according to increasing an angle between the zigzag pattern and a border line, disposed between the non-bending area and the bending area.

19. The device according to claim 1, wherein the zigzag pattern of the first insulation layer reduces a frequency of occurrence of cracks in the passivation layer.

20. The device according to claim 1, wherein the zigzag pattern of the first insulation layer induces a propagation of cracks occurred in the passivation layer.

* * * * *